(12) United States Patent
Koike et al.

(10) Patent No.: US 7,112,243 B2
(45) Date of Patent: Sep. 26, 2006

(54) METHOD FOR PRODUCING GROUP III NITRIDE COMPOUND SEMICONDUCTOR

(75) Inventors: Masayoshi Koike, Aichi (JP); Shiro Yamazaki, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 409 days.

(21) Appl. No.: 10/200,586

(22) Filed: Jul. 23, 2002

(65) Prior Publication Data

US 2003/0027407 A1  Feb. 6, 2003

(30) Foreign Application Priority Data

Jul. 23, 2001  (JP) ............................ 2001-221425

(51) Int. Cl.
C30B 29/38 (2006.01)
H01L 21/36 (2006.01)

(52) U.S. Cl. .................... 117/88; 117/952; 438/694; 438/695

(58) Field of Classification Search .............. 438/694, 438/695; 117/88, 952
See application file for complete search history.

(56) References Cited

U.S. PATENT DOCUMENTS

| | | | | |
|---|---|---|---|---|
| 5,210,051 | A | * | 5/1993 | Carter, Jr. .................. 438/22 |
| 5,620,557 | A | * | 4/1997 | Manabe et al. ............. 438/507 |
| 5,815,520 | A | * | 9/1998 | Furushima .................. 372/45 |
| 6,030,886 | A | * | 2/2000 | Yuri et al. .................. 438/493 |
| 6,153,010 | A | * | 11/2000 | Kiyoku et al. ............... 117/95 |
| 6,177,292 | B1 | * | 1/2001 | Hong et al. ................. 438/46 |
| 6,607,595 | B1 | * | 8/2003 | Manabe et al. ............. 117/88 |
| 6,627,552 | B1 | * | 9/2003 | Nishio et al. ............... 438/694 |
| 6,692,568 | B1 | * | 2/2004 | Cuomo et al. .............. 117/84 |

FOREIGN PATENT DOCUMENTS

| | | |
|---|---|---|
| JP | 63-23989 | 10/1988 |
| JP | 03-218625 | 9/1991 |
| JP | 4-196218 | 7/1992 |
| JP | 05-183189 | 7/1993 |
| JP | 05-198841 | 8/1993 |
| JP | 05-206520 | 8/1993 |
| JP | 7-273048 | 10/1995 |
| JP | 8-97190 | 4/1996 |
| JP | 2001-342100 | 12/2001 |
| JP | 2002-75871 | 3/2002 |

OTHER PUBLICATIONS

Japanese Office Action dated Jun. 22, 2004 with Partial English Translation.

* cited by examiner

Primary Examiner—Robert B. Davis
(74) Attorney, Agent, or Firm—McGinn IP Law Group PLLC

(57) ABSTRACT

The present invention provides a method for producing a Group III nitride compound semiconductor, which method permits only minimal reaction of the semiconductor with a hetero-substrate during epitaxial growth and induces no cracks in the Group III nitride compound semiconductor even when the semiconductor is cooled to room temperature. The method includes a buffer layer formation step for forming a gas-etchable buffer layer on the hetero-substrate, and a semiconductor formation step for epitaxially growing the Group III nitride compound semiconductor on the buffer layer through a vapor phase growth method, wherein at least a portion of the buffer layer is gas-etched during or after the semiconductor formation step.

24 Claims, 2 Drawing Sheets

METHOD FOR PRODUCING GROUP III NITRIDE COMPOUND SEMICONDUCTOR

The present application claims the Convention priority from Japanese Patent Application No. 2001-221425, the complete disclosures of which are hereby incorporated herein by reference.

BACKGROUND OF THE INVENTION

1. Field of the Invention

The present invention relates to a method for producing a Group III nitride compound semiconductor. More particularly, the invention relates to a method for producing a thick-film Group III nitride compound semiconductor or for producing a Group III nitride compound semiconductor having a thickness which allows the semiconductor to be handled as an epitaxial growth substrate. As used herein, the term "Group III nitride compound semiconductor" refers to a semiconductor having arbitrary compound crystal proportions and represented by $Al_xGa_yIn_{1-x-y}N$ ($0 \leq x \leq 1$; $0 \leq y \leq 1$; $0 \leq x+y \leq 1$), and encompasses 2-component semiconductors such as AlN, GaN, and InN; 3-component semiconductors such as $Al_xGa_{1-x}N$, $Al_xIn_{1-x}N$, and $Ga_xIn_{1-x}N$ (in each case, $0<x<1$); and 4-component semiconductors represented by $Al_xGa_yIn_{1-x-y}N$ ($0<x<1$; $0<y<1$; $0<x+y<1$). Unless otherwise specified, in the present specification the term "Group III nitride compound semiconductor" also encompasses such semiconductors which are doped with an impurity for determining a conduction type of p or n.

2. Background Art

When Group III nitride compound semiconductors such as those represented by $Al_xGa_yIn_{1-x-y}N$ ($0 \leq x \leq 1$; $0 \leq y \leq 1$; $0 \leq x+y \leq 1$) are produced through epitaxial growth, a substrate for growth is required. However, Group III nitride compound semiconductor substrates for use in epitaxial growth having a manageable thickness are not commercially available. Therefore, substrates produced from dissimilar materials other than Group III nitride compound semiconductors, such as a sapphire substrate, a silicon carbide (SiC) substrate, and a silicon (Si) substrate, have been employed instead.

As is well known, the dissimilar substrates have lattice constants which differ considerably from those of Group III nitride compound semiconductors. Thus, generally, a so-called buffer layer is grown on a dissimilar substrate in advance, and a Group III nitride compound semiconductor is epitaxially grown on the buffer layer. Even when this approach is employed, large thermal stress is generated by difference in thermal expansion coefficient between the dissimilar substrate and the Group III nitride compound semiconductor during cooling to room temperature after epitaxial growth conducted at a considerably high temperature of approximately 1,000° C. In other words, even though epitaxial growth can be successfully performed at high temperature, a significant difference in thermal expansion coefficient between the substrate and the Group III nitride compound semiconductor induces a large number of cracks in the dissimilar substrate and the Group III nitride compound semiconductor during cooling to room temperature. There is another drawback that the Group III nitride compound semiconductor and the dissimilar substrate are reacted with each other during crystal growth, affecting the quality of the epitaxial growth layer.

Specifically, approximate linear expansion coefficients (at about room temperature, along the a-axis) of gallium nitride (GaN), aluminum nitride (AlN), sapphire ($Al_2O_3$), and silicon (Si) are $5.6 \times 10^{-6}$/K, $4.2 \times 10^{-6}$/K, $7.5 \times 10^{-6}$/K, and $3.6 \times 10^{-6}$/K, respectively. Accordingly, when thick-film GaN is formed on a sapphire ($Al_2O_3$) substrate or a silicon (Si) substrate, followed by cooling by 1,000 K (or ° C.), a difference in shrinkage as large as 0.2% arises along the a-axis. Particularly when a GaN layer having a thickness of some mm is formed on a sapphire ($Al_2O_3$) substrate or a silicon (Si) substrate, cracks are inevitably generated in the formed GaN layer and in the sapphire ($Al_2O_3$) substrate or the silicon (Si) substrate, due to thermal stress during cooling.

From another viewpoint, production, through epitaxial growth, of a Group III nitride compound semiconductor, particularly gallium nitride (GaN), of an excellent single-crystalline state has been considered to require a high temperature of approximately 1,000° C. Even if a thick-film Group III nitride compound semiconductor crystal is produced, the dissimilar substrate is difficult to remove. When the dissimilar substrate is removed through chemical polishing, the two-layer structure consisting of the thick-film Group III nitride compound semiconductor crystal and the dissimilar hetero-substrate tends to be warped.

SUMMARY OF THE INVENTION

The present inventors have carried out extensive studies in order to solve the aforementioned problems. Thus, an object of the present invention is to provide a method for producing a Group III nitride compound semiconductor, which method permits only minimal reaction of the semiconductor with a dissimilar substrate during epitaxial growth and induces no cracks in the Group III nitride compound semiconductor even when the semiconductor is cooled by approximately 1,000° C. or more following epitaxial growth. Another object of the invention is to provide a method for producing a Group III nitride compound semiconductor, which method facilitates removal of a dissimilar substrate.

Accordingly, the present invention is drawn to a method for producing a Group III nitride compound semiconductor through epitaxial growth of the compound semiconductor by use of a substrate, the method comprising a buffer layer formation step for forming a buffer layer on the substrate, and a semiconductor formation step for epitaxially growing the Group III nitride compound semiconductor on the buffer layer through a vapor phase growth method, wherein at least a portion of the buffer layer is gas-etched during or after the semiconductor formation step.

Preferably, the buffer layer formation step is performed through sputtering.

Preferably, the semiconductor formation step includes supplying to a surface of the substrate a Group III element in the form of a halide thereof.

Preferably, gas etching is performed by use of an etchant predominantly comprising a hydrogen halide. By the word "predominantly" is meant to cover any case where etching is performed through introduction of a hydrogen halide into a corresponding etching system, and thus the word is not intended to be used to specify the chemical species.

Preferably, the buffer layer is formed of zinc oxide (ZnO).

In order to produce a Group III nitride compound semiconductor of good crystallinity, vapor phase growth of the semiconductor must be performed at a high temperature; e.g., approximately 1,000° C. If a buffer layer connecting a dissimilar or hetero-substrate to the epitaxially-grown Group III nitride compound semiconductor is gas-etched at such a high temperature, no thermal stress is generated between the Group III nitride compound semiconductor and the dissimilar substrate when the temperature is lowered to room temperature. Although the buffer layer is not completely gas-etched, thermal stress between the Group III nitride compound semiconductor and the substrate can be reduced when the temperature is lowered to room temperature. The above gas etching of the buffer layer may be performed at any timing during epitaxial growth of the Group III nitride compound semiconductor, or may be performed while epitaxial growth is stopped. Needless to say, gas etching may be repeated.

Through sputtering, a buffer layer having a lattice constant differing from that of the dissimilar substrate and approximately equal to that of a Group III nitride compound semiconductor can be readily provided. Thus, by use of the buffer layer, a Group III nitride compound semiconductor of good crystallinity can be produced.

When a Group III element is supplied through a halide VPE method or a halogen transportation method such as a chloride method employing a chloride, epitaxial growth of a Group III nitride compound semiconductor can be performed very rapidly. Ammonia or any other nitrogen compound may be employed as a nitrogen source.

When an etchant predominantly comprising a hydrogen halide is employed in gas etching, management of the etchant is remarkably easy, and conditions for preventing etching of a Group III nitride compound semiconductor can be readily determined.

A buffer layer formed of zinc oxide (ZnO) can be easily gas-etched, and methods for forming a zinc oxide layer on a variety of dissimilar substrates have been established. Particularly, since zinc oxide (ZnO) has a lattice constant approximately equal to that of sapphire and that of a Group III nitride compound semiconductor, zinc oxide (ZnO) can serve as a buffer layer for forming a high-quality Group III nitride compound semiconductor on a sapphire substrate.

As described above, a Group III nitride compound semiconductor thick layer can be formed on a dissimilar substrate having a buffer layer which has been at least partially etched, and the dissimilar substrate can be readily removed. The thus-produced Group III nitride compound semiconductor layer can serve as a substrate for epitaxially growing a desired Group III nitride compound semiconductor or a substrate for fabricating a Group III nitride compound semiconductor element.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with accompanying drawings, in which.

DETAILED DESCRIPTION OF PREFERRED EMBODIMENTS

Embodiments of the present invention will next be described with reference to the appended drawings. However, the embodiments should not be construed as limiting the invention thereto.

First Embodiment

Figure 1A:
FIGS. 1A to 1F are cross-sectional views showing steps of a method for producing a Group III nitride compound semiconductor according to a first embodiment of the present invention.
Figure 1B:
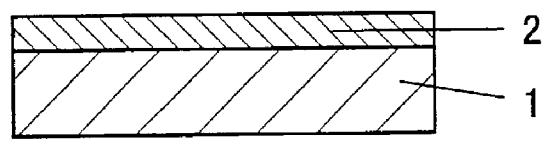

FIGS. 1A to 1F are cross-sectional views showing steps of a method for producing a Group III nitride compound semiconductor according to a first embodiment of the present invention. A sapphire substrate 1 having a (0001) plane (c plane) serving as a main crystal plane is provided and washed with an organic chemical such as methanol. Subsequently, the sapphire substrate 1 is placed in a chamber of an RF sputtering apparatus, and the chamber is evacuated in vacuo (FIG. 1A). On the c plane of the sapphire substrate 1, a ZnO intermediate layer (buffer layer) 2 having a thickness of 100 nm is formed though sputtering of a ZnO target by use of argon-oxygen mixture gas. The intermediate layer 2 is strongly oriented to the c axis of the sapphire substrate 1 (FIG. 1B).

Figure 1C:
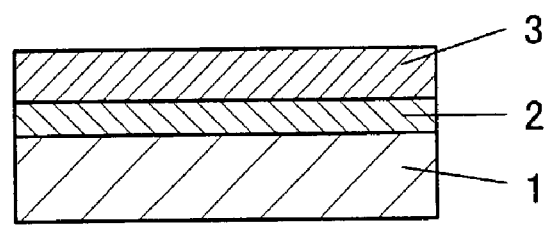
Figure 1D:
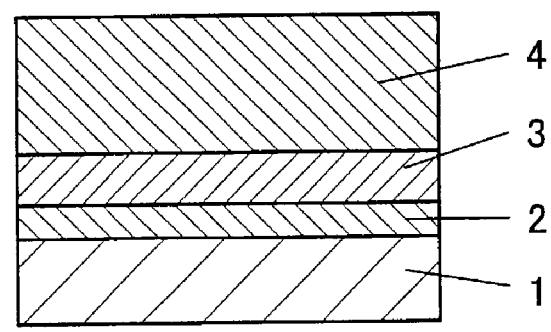

The sapphire substrate 1 on which the intermediate layer 2 has been formed is placed in a chamber of a halogen transportation apparatus. After the chamber has been evacuated in vacuo and nitrogen gas has been introduced, the sapphire substrate 1 is heated to approximately 500° C., at which growth of a GaInN mono-crystal is possible. Through the above heating, the orientation of ZnO forming the intermediate layer 2 to the c axis is further enhanced, thereby enabling growth of mono-crystalline GaInN on the intermediate layer 2. As a gallium (Ga) source gas, an indium (In) source gas, and a nitrogen (N) source gas, there are employed $GaCl_x$ (x=1–3, depending on the formation temperature) which has been formed through reaction of Ga and hydrogen chloride (HCl) at high temperature; $InCl_x$ (x=1–3, depending on the formation temperature and independently of the "x" in $GaCl_x$) which has been formed through reaction of In and hydrogen chloride (HCl) at high temperature; and ammonia ($NH_3$), respectively. $GaCl_x$, $InCl_x$, and $NH_3$ are supplied onto the sapphire substrate 1, to thereby grow a GaInN layer 3 to a thickness of approximately 10 μm (FIG. 1C). Then, the temperature of the sapphire substrate 1 is elevated to approximately 800° C., and $GaCl_x$ and $NH_3$ are supplied, to thereby grow a GaN layer 4 on the GaInN layer 3 (FIG. 1D). During growth of these layers, a carrier gas such as $H_2$, $N_2$, Ar, or a mixture thereof is used.

Figure 1E:
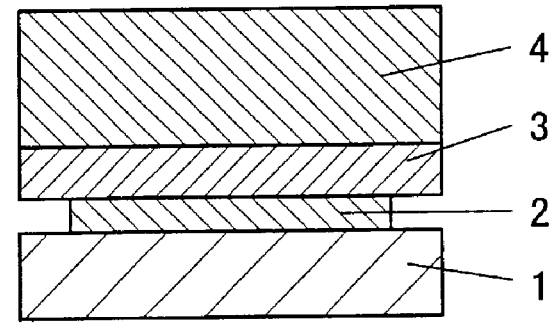
Figure 1F:
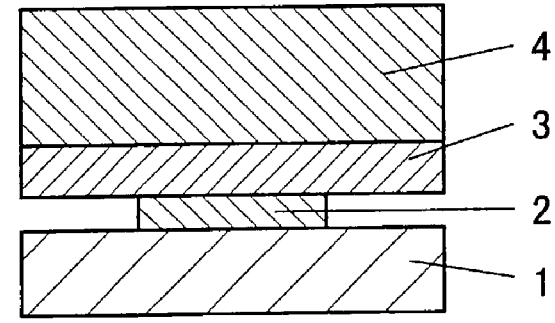

Subsequently, when an excessive amount of hydrogen chloride (HCl) gas is supplied to the surface of the sapphire substrate 1, the ZnO intermediate layer 2 is etched by hydrogen chloride (HCl) gas from the periphery thereof (FIG. 1E). Through etching, the GaN layer 4 can be grown to a thickness of approximately 200 μm or more, and the region of the ZnO intermediate layer 2 that connects the GaInN layer 3 to the sapphire substrate 1 can be narrowed (FIG. 1F) When the thus-processed stacked body is cooled in the chamber to room temperature, the thermal stress generated due to the difference in thermal expansion coefficient between the sapphire substrate 1 and the GaN layer 4 almost converges in the small region of the ZnO intermediate layer (buffer layer) 2 that connects the GaInN layer 3 to the sapphire substrate 1. Even though cracks are generated in the ZnO intermediate layer (buffer layer) 2 by thermal stress, these cracks do not further induce cracks in the thick GaN layer 4. Accordingly, a Group III nitride compound semiconductor thick layer having a thickness of some hundreds μm to some mm can be produced without generating cracks that would otherwise be induced by thermal stress exerted from the dissimilar substrate. By removing the dissimilar substrate, the semiconductor layer can serve as a substrate for epitaxially growing a desired Group III nitride compound semiconductor or as a substrate for fabricating a Group III nitride compound semiconductor element. It should be noted that the buffer layer also plays a role of preventing reaction of the dissimilar substrate and the Group III nitride compound semiconductor.

Second Embodiment

FIGS. 2A to 2E are cross-sectional views showing steps of a method for producing a Group III nitride compound semiconductor according to the second embodiment of the present invention. This embodiment includes growing a GaN layer 3 to a desired thickness, followed by etching a ZnO intermediate layer 2 by use of hydrogen chloride (HCl) gas.

Figure 2A:
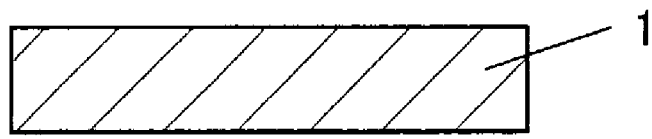
FIGS. 2A to 2E are cross-sectional views showing steps of a method for producing a Group III nitride compound semiconductor according to a second embodiment of the present invention.
Figure 2B:
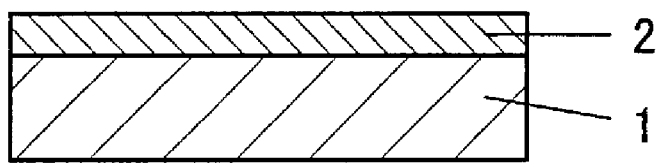
Figure 2C:
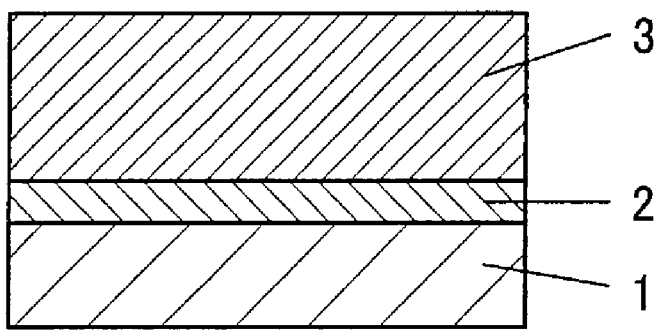

A sapphire substrate 1 having a (0001) plane (c plane) serving as a main crystal plane is washed and placed in a chamber of an RF sputtering apparatus (FIG. 2A). The chamber is evacuated in vacuo, and a ZnO intermediate layer (buffer layer) 2 having a thickness of 100 nm is formed on the c plane of the sapphire substrate 1 though sputtering of a ZnO target by use of argon-oxygen mixture gas (FIG. 2B). Then, the sapphire substrate 1 on which the intermediate layer 2 has been formed is placed in a chamber of a halogen transportation apparatus. After the chamber has been evacuated in vacuo and purged with nitrogen gas, the sapphire substrate 1 is heated to 1,000° C., at which growth of a GaN mono-crystal is possible. GaCl and $NH_3$ are supplied to the sapphire substrate 1, to thereby grow a GaN layer 3 to a thickness of approximately 200 μm (FIG. 2C).

Figure 2D:
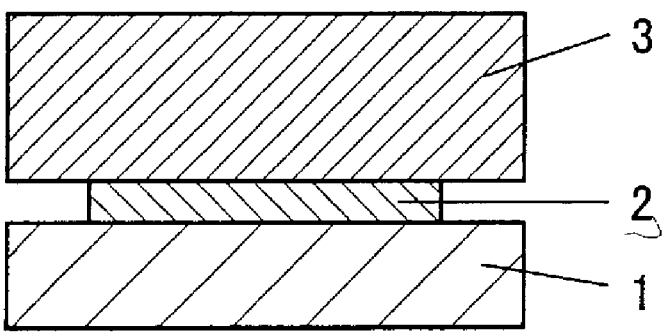
Figure 2E:
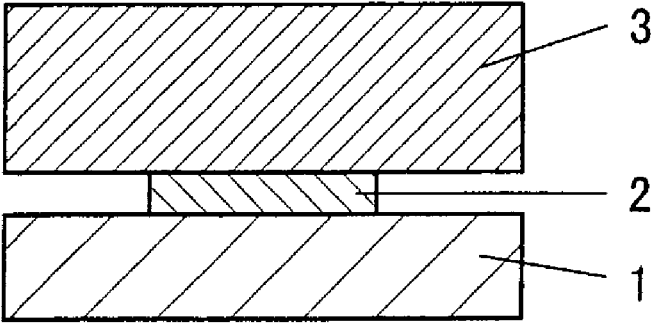

Subsequently, hydrogen chloride (HCl) gas is supplied, to thereby etch the ZnO intermediate layer 2 from the periphery thereof (FIG. 2D). Through etching, the region of the ZnO intermediate layer 2 that connects the GaN layer 3 to the sapphire substrate 1 can be narrowed (FIG. 2E). If growth of the GaN layer and etching of ZnO by HCl gas are alternately performed, warpage and delamination of the GaN layer is promoted as thickening of the GaN layer, thereby finally separating the GaN film from the sapphire substrate. Accordingly, a Group III nitride compound semiconductor thick layer having a thickness of some hundreds μm to some mm can be produced without generating cracks that would otherwise be induced by thermal stress exerted from the dissimilar substrate. By removing the dissimilar substrate, the semiconductor layer can serve as a substrate for epitaxially growing a desired Group III nitride compound semiconductor or as a substrate for fabricating a Group III nitride compound semiconductor element.

Modification

In the second embodiment, the temperature of etching of the ZnO intermediate layer (buffer layer) 2 by hydrogen chloride (HCl) gas may be higher or lower than the growth temperature of the GaN layer 3. When the etching temperature is elevated to such a level that the GaN layer 3 is not greatly damaged through decomposition, the rate of etching of the ZnO intermediate layer 2 by hydrogen chloride (HCl) gas can be increased. When hydrogen chloride (HCl) gas is supplied while the temperature is lowered from the growth temperature of the GaN layer 3 to room temperature, the thermal stress generated due to the difference in thermal expansion coefficient between the sapphire substrate 1 and the GaN layer 3 almost converges in the ZnO intermediate layer 2 that connects the GaN layer 3 to the sapphire substrate 1. In this case, the sapphire substrate 1 is significantly warped, to thereby generate cracks in the interface between the sapphire substrate 1 and the ZnO intermediate layer 2 or other portions. Thus, the surface area of the ZnO intermediate layer 2 exposed to hydrogen chloride (HCl) gas increases. Through increase in surface area, the region of the ZnO intermediate layer (buffer layer) 2 that connects the GaN layer 3 to the sapphire substrate 1 can also be narrowed, to thereby yield the thick GaN layer 3 without generating cracks therein.

Although in the first and second embodiments the intermediate layer (buffer layer) 2 has a thickness of 100 nm, thickness values falling within a range of 10 nm to 1 μm may be employed. In the first and second embodiments, the intermediate layer (buffer layer) 2 is formed by sputtering of ZnO. However, the buffer layer (intermediate layer 2) according to the present invention may be formed through any methods, from arbitrary material which can be etched by a gas etchant. In the above case, a sapphire substrate is employed as a dissimilar substrate. However, dissimilar substrates formed of any materials can be used, so long as the substrates allow formation of the buffer layer (intermediate layer 2). In the first and second embodiments, gallium nitride (GaN), a type of Group III nitride compound semiconductor, is grown through a chloride method (halide VPE), which is a vapor phase method. However, the present invention can be applied to any type of Group III nitride compound semiconductor. As used in the present invention, the term "Group III nitride compound semiconductor" also encompasses semiconductors which contain a Group III element such as boron (B) or thallium (Tl) and in which nitrogen atoms are partially substituted by one or more Group V elements such as phosphorus (P), arsenic (As), antimony (Sb), and bismuth (Bi).

The present invention has been described in detail with reference to the above embodiments serving as most practical and appropriate examples. However, the present invention is not limited to these embodiments, and appropriate modifications and applications can be made without deviating from the scope of the present invention.

What is claimed is:

1. A method for producing a Group III nitride compound semiconductor through epitaxial growth of the compound semiconductor by use of a substrate, the method comprising:

forming a buffer layer on said substrate; and epitaxially growing a Group III nitride compound semiconductor on said buffer layer through a vapor phase growth method, wherein at least a portion of said buffer layer is gas-etched during said epitaxially growing a Group III nitride compound semiconductor in a same chamber in which said Group III nitride compound semiconductor is grown epitaxially.

2. A method for producing a Group III nitride compound semiconductor according to claim 1, wherein said forming a buffer layer comprises sputtering.

3. A method for producing a Group III nitride compound semiconductor according to claim 1, wherein said epitaxially growing a Group III nitride compound semiconductor comprises supplying to a surface of said substrate a Group III element in the form of a halide thereof.

4. A method of producing a Group III nitride compound semiconductor through epitaxial growth of the compound semiconductor by use of a substrate, the method comprising:

forming a buffer layer on said substrate; and epitaxially growing a Group III nitride compound semiconductor on said buffer layer through a vapor phase growth method, wherein at least a portion of said buffer layer is gas-etched after said epitaxially growing a Group III nitride compound semiconductor and before starting cooling said substrate in a same chamber in which said Group III nitride compound semiconductor is grown epitaxially.

5. A method for producing a Group III nitride compound semiconductor according to claim 4, wherein said epitaxially growing a Group III nitride compound semiconductor comprises supplying to a surface of said substrate a Group III element in the form of a halide thereof.

6. A method for producing a Group III nitride compound semiconductor according to claim 1, wherein gas etching is performed by use of an etchant predominantly comprising a hydrogen halide.

7. A method for producing a Group III nitride compound semiconductor according to claim 2, wherein gas etching is performed by use of an etchant predominantly comprising a hydrogen halide.

8. A method for producing a Group II nitride compound semiconductor according to claim 4, wherein gas etching is performed by use of an etchant predominantly comprising a hydrogen halide.

9. A method for producing a Group III nitride compound semiconductor according to claim 5, wherein gas etching is performed by use of an etchant predominantly comprising a hydrogen halide.

10. A method for producing a Group III nitride compound semiconductor according to claim 6, wherein the hydrogen halide comprises hydrogen chloride.

11. A method for producing a Group III nitride compound semiconductor according to claim 7, wherein the hydrogen halide comprises hydrogen chloride.

12. A method for producing a Group III nitride compound semiconductor according to claim 8, wherein the hydrogen halide comprises hydrogen chloride.

13. A method for producing a Group III nitride compound semiconductor according to claim 9, wherein the hydrogen halide comprises hydrogen chloride.

14. A method for producing a Group III nitride compound semiconductor according to claim 1, wherein the buffer layer comprises zinc oxide (ZnO).

15. A method for producing a Group III nitride compound semiconductor according to claim 10, wherein the buffer layer comprises zinc oxide (ZnO).

16. A method for producing a Group III nitride compound semiconductor according to claim 11, wherein the buffer layer comprises zinc oxide (ZnO).

17. A method for producing a Group III nitride compound semiconductor according to claim 4, wherein the buffer layer comprises zinc oxide (ZnO).

18. A method for producing a Group III nitride compound semiconductor according to claim 13, wherein the buffer layer comprises zinc oxide (ZnO).

19. A method for producing a Group III nitride compound semiconductor according to claim 2, wherein said sputtering comprises sputtering using an argon-oxygen mixture gas.

20. A method for producing a Group III nitride compound semiconductor according to claim 1, wherein said buffer layer is gas-etched using hydrogen chloride gas.

21. A method for producing a Group III nitride compound semiconductor according to claim 1, wherein said at least a portion of said buffer layer comprises a periphery portion of said buffer layer.

22. A method for producing a Group III nitride compound semiconductor according to claim 1, further comprising:

alternately performing said epitaxially growing a Group III nitride compound semiconductor and etching of said at least a portion of said buffer layer.

23. A method for producing a Group III nitride compound semiconductor according to claim 1, wherein said buffer layer comprises a thickness of 10 nm to 1nm.

24. A method for producing a Group III nitride compound semiconductor according to claim 1, wherein only said buffer layer is gas-etched during said epitaxially growing a Group III nitride compound semiconductor hydrogen halide.

* * * * *

UNITED STATES PATENT AND TRADEMARK OFFICE
CERTIFICATE OF CORRECTION

PATENT NO. : 7,112,243 B2  Page 1 of 1
APPLICATION NO. : 10/200586
DATED : September 26, 2006
INVENTOR(S) : Masayoshi Koike et al.

It is certified that error appears in the above-identified patent and that said Letters Patent is hereby corrected as shown below:

In claim 24, column 8, line 40 : delete "hydrogen halide"

Signed and Sealed this

Second Day of January, 2007

JON W. DUDAS
*Director of the United States Patent and Trademark Office*